(12) United States Patent
Cho et al.

(10) Patent No.: US 7,808,108 B2
(45) Date of Patent: Oct. 5, 2010

(54) THIN FILM CONDUCTOR AND METHOD OF FABRICATION

(75) Inventors: Beom-seok Cho, Seoul (KR); Je-hun Lee, Seoul (KR); Chang-oh Jeong, Suwon-si (KR); Yang-ho Bae, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 599 days.

(21) Appl. No.: 11/502,918

(22) Filed: Aug. 11, 2006

(65) Prior Publication Data

US 2007/0034954 A1    Feb. 15, 2007

(30) Foreign Application Priority Data

Aug. 12, 2005    (KR) ...................... 10-2005-0074455

(51) Int. Cl.
*H01L 29/43*    (2006.01)
(52) U.S. Cl. .................... 257/762; 257/753; 349/147
(58) Field of Classification Search .......... 257/753, 257/762; 349/147, 148
See application file for complete search history.

(56) References Cited

U.S. PATENT DOCUMENTS

| | | | |
|---|---|---|---|
| 2004/0178411 A1* | 9/2004 | Misaki et al. ................. | 257/72 |
| 2004/0232443 A1 | 11/2004 | Cho et al. | |
| 2005/0019203 A1* | 1/2005 | Saitoh et al. ................. | 420/506 |

FOREIGN PATENT DOCUMENTS

| | | |
|---|---|---|
| JP | 5-129489 | 5/1993 |
| JP | 2003-36037 | 2/2003 |
| JP | 2004-131747 | 4/2004 |
| JP | 2004-140319 | 5/2004 |

OTHER PUBLICATIONS

Patent Abstracts of Japan, Publication No. 05-129489, May 25, 1993, 1 p.
Patent Abstracts of Japan, Publication No. 2003-036037, Feb. 7, 2003, 2. pp.
Patent Abstracts of Japan, Publication No. 2004-131747, Apr. 30, 2004, 1 p.
Patent Abstracts of Japan, Publication No. 2004-140319, May 13, 2004, 1 p.
Office Action of Mar. 13, 2009 from State Intellectual Property Office of P.R.C for App. No. 200610112109.X.

* cited by examiner

*Primary Examiner*—Wael M Fahmy
*Assistant Examiner*—Abul Kalam
(74) *Attorney, Agent, or Firm*—Innovation Counsel LLP

(57) ABSTRACT

A thin film conductor having improved adhesion and superior conductivity, a method for fabricating the same, a thin film transistor (TFT) plate including the thin film conductor, and a method for fabricating the TFT plate are provided. The thin film conductor includes an adhesive layer containing an oxidation-reactive metal or silicidation-reactive metal and silver, a silver conductive layer formed on the adhesive layer, and a protection layer formed on the silver conductive layer and containing an oxidation-reactive metal and silver.

19 Claims, 11 Drawing Sheets

THIN FILM CONDUCTOR AND METHOD OF FABRICATION

REFERENCE TO RELATED APPLICATION

This application claims priority from Korean Patent Application No. 10-2005-0074455 filed on Aug. 12, 2005 in the Korean Intellectual Property Office, the disclosure of which is incorporated herein by reference in its entirety.

FIELD OF THE INVENTION

The present invention relates to a thin film conductor, a method for fabricating the same, a thin film transistor (TFT) plate, and a method for fabricating the same, and more particularly, to a thin film conductor having improved adhesion and superior conductivity, a method for fabricating the thin film conductor, a TFT plate including the thin film conductor, and a method for fabricating the TFT plate.

DESCRIPTION OF THE RELATED ART

An LCD, which is one of the most widely used flat panel displays, includes two substrates having a plurality of electrodes and a liquid crystal layer interposed therebetween and adjusts the amount of light transmitted therethrough by applying a voltage to the electrodes to rearrange liquid crystal molecules in the liquid crystal layer.

Presently, a general LCD including two plates provided with field-generating electrodes is widely used. Specifically, the general LCD includes one plate provided with a plurality of pixel electrodes arranged in a matrix array and the other plate provided with a common electrode. The LCD displays desired images by adjusting the voltage difference between the pixel electrodes and the common electrode. To this end, a thin film transistor (TFT), which is a three-terminal element for switching different voltages to the respective pixel electrodes, is connected to each pixel electrode. In addition, a gate thin film conductor including a gate line transmitting a signal controlling the TFT, and a data thin film conductor including a data line transmitting a voltage to be applied to the gate thin film conductor are formed on the substrate.

As the display area of the LCD or the organic EL display device increases, the gate lines and the data lines connected to the TFTs also grow longer, causing an increase in the resistance of a thin film conductor. To solve a signal delay problem resulting from the increase in the resistance, the gate lines and the data lines should be formed of a material having as low a resistivity as possible.

Among materials for a thin film conductor of liquid crystal display (LCD) devices, silver (Ag) is known to have a resistivity of approximately 1.59 μΩcm. Thus, a signal delay problem can be solved through use of gate thin film conductors and data thin film conductors made of silver in actual processes. However, silver has poor adhesion to a lower structure such as a substrate formed of glass or a semiconductor substrate made of intrinsic amorphous silicon or doped amorphous silicon. As a result, silver is not easy to deposit and is vulnerable to lifting or peeling of a thin film conductor. Moreover, because of its poor thermal endurance and chemical resistance, silver lumps by high-temperature heat and is easily corroded by an etchant.

SUMMARY OF THE INVENTION

The present invention provides a thin film conductor having superior adhesion and conductivity and a method for fabricating the same.

The present invention also provides a thin film transistor (TFT) plate including a thin film conductor having superior adhesion and conductivity and a method for fabricating the TFT plate.

According to an aspect of the present invention, there is provided a thin film conductor. The thin film conductor includes an adhesive layer containing an oxidation-reactive metal or a silicidation-reactive metal and silver, a silver conductive layer formed on the adhesive layer, and a protection layer formed on the silver conductive layer and containing the oxidation-reactive metal and silver.

According to another aspect of the present invention, there is provided a method for fabricating a thin film conductor, the method including sequentially depositing a first silver alloy layer containing a silicidation-reactive metal or an oxidation-reactive metal, a silver conductive layer, and a second silver alloy silver containing an oxidation-reactive metal, and performing a thermal process on the resultant structure, thereby forming an adhesive layer through silicidation of the silicidation-reactive metal included in the first silver alloy layer or oxidation of the oxidation-reactive metal included in the first silver alloy layer and forming a protection layer through oxidation of the oxidation-reactive metal included in the second silver alloy layer.

According to still another aspect of the present invention, there is provided a thin film transistor (TFT) plate including a gate thin film conductor including a gate line extending in a first direction, and a data thin film conductor including a data line insulated from the gate thin film conductor, intersecting the gate thin film conductor, and extending in a second direction, wherein at least one selected from the group consisting of the gate thin film conductor and the data thin film conductor includes a thin film conductor where an adhesive layer containing a silicidation-reactive metal or an oxidation-reactive metal and silver, a silver conductive layer, and a protection layer containing an oxidation-reactive metal and silver are sequentially deposited.

According to a further aspect of the present invention, there is provided a method for fabricating a thin film transistor (TFT) plate, the method including forming a gate thin film conductor including a gate line extending in a first direction, and forming a data thin film conductor including a data line insulated from the gate thin film conductor, intersecting the gate thin film conductor, and extending in a second direction, wherein at least one of the formation of the gate thin film conductor or the data thin film conductor includes sequentially depositing a first silver alloy layer containing a silicidation-reactive metal or an oxidation-reactive metal, a silver conductive layer, and a second silver alloy silver containing an oxidation-reactive metal and performing a thermal process on the resultant structure, thereby forming an adhesive layer through silicidation of the silicidation-reactive metal included in the first silver alloy layer or oxidation of the oxidation-reactive metal included in the first silver alloy layer and forming a protection layer through oxidation of the oxidation-reactive metal included in the second silver alloy layer.

BRIEF DESCRIPTION OF THE DRAWINGS

The above and other features and advantages of the present invention will become more apparent by describing in detail exemplary embodiments thereof with reference to the attached drawings in which:

FIGS. 13B through 18 are sectional views showing processing steps taken along a line B-B' of FIG. 13A.

DETAILED DESCRIPTION OF THE INVENTION

Figure 1:
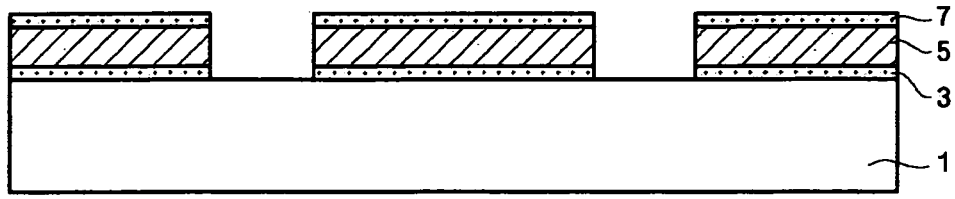
FIGS. 1 through 3 are sectional views of a thin film conductor according to embodiments of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The present invention will now be described more fully with reference to the accompanying drawings, in which preferred embodiments of the invention are shown.

Figure 2:
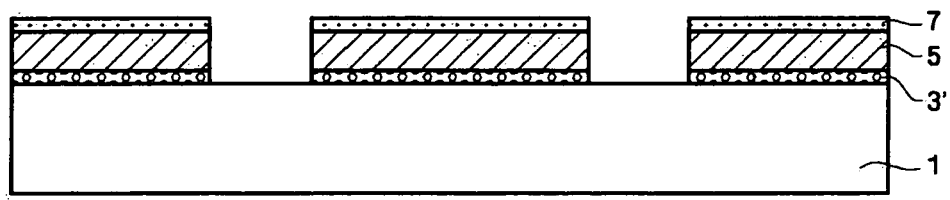
Figure 3:
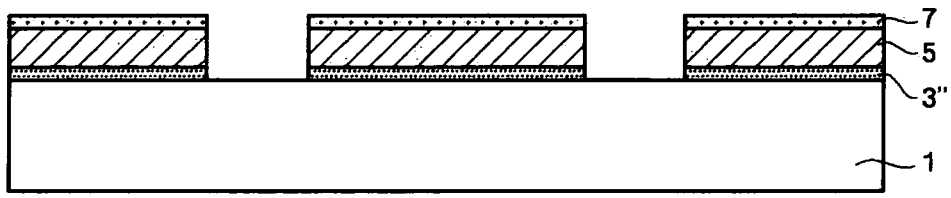

First, a thin film conductor according to embodiments of the present invention will be described. FIGS. 1 through 3 are sectional views of a thin film conductor according to embodiments of the present invention.

As shown in FIG. 1, a thin film conductor according to an embodiment of the present invention has an adhesive layer 3, a silver conductive layer 5 and a protection layer 7 formed on a substrate 1. The adhesive layer 3 includes an oxidation-reactive metal having high reactivity with oxygen and silver. The protection layer 7 includes the same oxidation-reactive metal as that included in the adhesive layer 3.

The adhesive layer 3 is an alloy layer containing an oxidized metal, formed through a reaction between an oxidation-reactive metal and oxygen, and silver and has superior adhesion to the substrate 1 under the adhesive layer 3. The oxidation reactive metal may comprise, but not limited to, at least one metal selected from the group consisting of Mg, Al, Li, Zn, In and Sn as long as it reacts with oxygen. The concentration of the oxidation-reactive metal contained in the adhesive layer may be in a range of approximately 0.1 to approximately 50 at %. At this time, the concentration of the oxidation-reactive metal contained in the adhesive layer 3 is not constant. In other words, a concentration gradient is created in such a manner that a concentration of the oxidation-reactive metal increases towards an interface between the substrate 1 and the adhesive layer 3 from an interface between the adhesive layer 3 and the silver conductive layer 5.

The silver conductive layer 5 deposited on the adhesive layer 3 functions as an electric signal path that is the intrinsic function of a thin film conductor and has low resistivity.

The protection layer 7 formed on the silver conductive layer 5 is an alloy layer containing oxidized metal, formed through a reaction between the oxidation-reactive metal that is the same as included in the adhesive layer 3 and oxygen, and silver and protects the silver conductive layer 5 having poor thermal endurance and chemical resistance during a subsequent thermal process or etching process. The oxidation-reactive metal may be included in the protection layer 7 in an amount of approximately 0.1 to approximately 50 at %. At this time, the concentration of the oxidation-reactive metal contained in the protection layer 7 is not constant. In other words, the concentration gradient is created in such a manner that the concentration of the oxidation-reactive metal increases towards the surface of the protection layer 7 from an interface between the silver conductive layer S and the protection layer 7.

Referring to FIG. 2, the thin film conductor according to another embodiment of the present invention is the same as the thin film conductor according to the embodiment of the present invention except that an adhesive layer 3', a silver conductive layer 5 and a protection layer 7 containing an oxidation-reactive metal are provided on a substrate 1, and the oxidation-reactive metals included in the adhesive layer 3' and the protection layer 7 are different from each other. Like in the thin film conductor according to the embodiment of the present invention, the adhesive layer 3' has superior adhesion to the substrate 1, the silver conductive layer 5 functions as an electric signal path, and the protection layer 7 protects the silver conductive layer 5.

Referring to FIG. 3, a thin film conductor according to still another embodiment of the present invention includes an adhesive layer 3" containing a silicidation-reactive metal having high reactivity with silicon, a silver conductive layer 5, and a protection layer 7 containing an oxidation-reactive metal on a substrate 1. Here, the substrate 1 under the thin film conductor should include silicon.

The protection layer 7 is an alloy layer containing a silicidized metal, formed through a reaction between the silicidation-reactive metal and silicon included in the substrate 1, and silver and has superior adhesion to the substrate 1. In this case, the silicidation-reactive metal may comprise, but not limited to, at least one metal selected from the group consisting of Ca, Th, Zr, Co, Ni, Ti, V, Nb, Mo, Ta, W and Cr as long as it reacts with silicon. The concentration of the silicidation-reactive metal included in the adhesive layer 3" may be in an amount of approximately 0.1 to approximately 50 at %. At this time, the concentration of silicidation-reactive metal contained in the adhesive layer 3" is not constant. In other words, a concentration gradient is created in such a manner that the concentration of the silicidation-reactive metal increases towards an interface between the substrate 1 and the adhesive layer 3" from an interface between the adhesive layer 3" and the silver conductive layer 5.

Like in the thin film conductor according to the embodiment of the present invention, the silver conductive layer 5 formed on the adhesive layer 3" functions as an electric signal path. The protection layer 7, which is formed on the silver conductive layer 5, is an alloy layer containing an oxidized metal and silver, the oxidized metal formed through a reaction between an oxidation-reactive metal and oxygen, and protects the silver conductive layer 5.

Next, a method for fabricating a thin film conductor according to an embodiment of the present invention will be described with reference to FIG. 1 and FIGS. 4 through 6.

Figure 4:
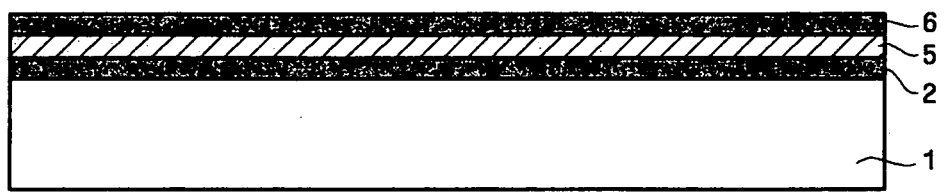
FIGS. 4 through 6 are sectional views showing processing steps of a method for fabricating a thin film conductor according to an embodiment of the present invention.
Figure 5:
Figure 5:
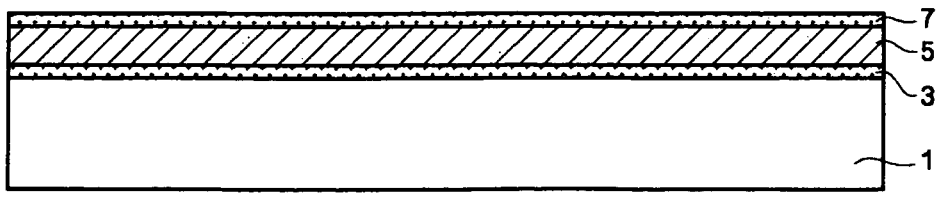
Figure 6:
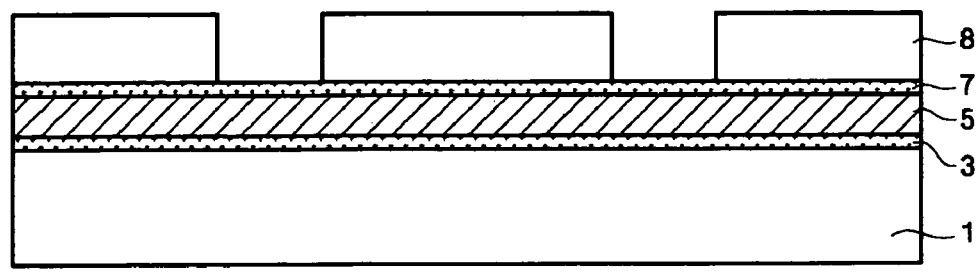

FIGS. 4 through 6 are sectional views showing processing steps of a method for fabricating a thin film conductor according to an embodiment of the present invention.

As shown in FIG. 4, sputtering is performed on a substrate 1 made of glass made of $SiO_2$ with a target of a silver alloy containing silver as a main element and 0.1-50 at % of an oxidation-reactive metal, thereby forming a first silver alloy layer 2. The oxidation reactive metal may comprise, but not limited to, at least one metal selected from the group consisting of Mg, Al, Li, Zn, In and Sn as long as it reacts with oxygen. At this time, the thickness of the first silver alloy layer 2 is not specified. However, since the resistivity of the thin film conductor may increase when the thickness of the first silver alloy layer 2 is overly thick, it is preferable that the thickness of the first silver alloy layer 2 be in a range of 100-2000 Å.

Next, sputtering is performed on the first silver alloy layer 2 with a target of silver, thereby forming a silver conductive layer 5. The silver conductive layer 5 may serve as a passage of an electric signal, that is, an intrinsic function of a thin film conductor. Preferably, the silver conductive layer 5 may have a thickness in a range of 1000-3000 Å.

Next, sputtering is performed on the silver conductive layer 5, thereby forming a second silver alloy layer 6 with a target of a silver alloy containing silver as a main element and 0.1-50 at % of an oxidation-reactive metal. The oxidation-reactive metal may comprise a metal the same as or different from that contained in the first silver alloy layer 2. Although the oxidation-reactive metal included in the first silver alloy layer 2 and the second silver alloy layer 6 are the same as each other in the current embodiment of the present invention, the method for fabricating the thin film conductor according to the embodiment of the present invention can also be applied to a case where the oxidation-reactive metal included in the first silver alloy layer 2 and the second silver alloy layer 6 are different from each other.

Like the oxidation-reactive metal included in the first silver alloy layer 2, the oxidation-reactive metal included in the second silver alloy layer 6 may be formed of at least one selected from the group consisting of Mg, Al, Li, Zn, In, and Sn. At this time, the thickness of the first silver alloy layer 2 is not specified. However, since the resistivity of a thin film conductor may increase when the thickness of silver alloy layer is large, it is preferable that the thickness of the silver alloy layer be in a range of 500-2000 Å.

Next, as shown in FIG. 5, which is a kind of a thermal process, is performed on the resultant substrate 1 including the first silver alloy layer (2 of FIG. 4), the silver conductive layer 5, and the second silver alloy layer (6 of FIG. 4).

The annealing is performed under vacuum, or in an atmosphere of nitrogen or a small amount of oxygen, and the annealing temperature and duration are approximately 200 to 300° C. and approximately 30 minutes to 2 hours, respectively.

As a result of the thermal process, the oxidation-reactive metal included in the first silver alloy layer (2 of FIG. 4) and the second silver alloy layer (6 of FIG. 4) are more rapidly diffused than silver and move to an interface between the substrate 1 and the first silver alloy layer (2 of FIG. 4) and the surface of the second silver alloy layer (6 of FIG. 4). The oxidation-reactive metal having moved to the interface with the substrate 1 reacts with $SiO_2$ included in the substrate 1, thereby forming an oxidized metal. The oxidation-reactive metal having moved to the surface of the second silver alloy layer (6 of FIG. 4) reacts with oxygen in the air, thereby forming an oxidized metal. For example, when the oxidation-reactive metal is Mg or Al, it reacts with oxygen through the thermal process, thereby forming an oxidized metal such as MgO or $Al_2O_3$.

Such a layer containing the oxidized metal becomes the adhesive layer 3 for improving adhesion to the substrate 1 and/or the protection layer 7 protecting the silver conductive layer 5 having poor thermal endurance and chemical resistance. The concentration of the oxidation-reactive metal included in the adhesive layer 3 and/or the protection layer 7 is not constant. In other words, a concentration gradient is created in such a manner that the concentration of the oxidation-reactive metal included in the adhesive layer 3 increases towards the interface between the substrate 1 and the adhesive layer 3 from the interface between the adhesive layer 3 and the silver conductive layer 5. In addition, a concentration gradient is created so that the concentration of the oxidation-reactive metal included in the protection layer 7 increases towards the surface of the protection layer 7 from the interface between the silver conductive layer 5 and the protection layer 7. Thicknesses of the adhesive layer 3 and the protection layer 7 may vary according to the thicknesses of the first alloy layer (2 of FIG. 4) and the second silver alloy layer (6 of FIG. 4). For example, when the thicknesses of the untreated first alloy layer 2 and the second silver alloy layer 6 are approximately 500 Å and 1000 Å, respectively, the thicknesses of the adhesive layer 3 and the protection layer 7 may be approximately 200 Å and 150 Å, respectively.

Next, as shown in FIG. 6, a photosensitive layer is formed on the resultant structure of the thermal process including the adhesive layer 3, the silver conductive layer 5, and the protection layer 7 and is then patterned into a desired shape, thereby forming a photosensitive layer pattern 8.

Finally, referring back to FIG. 1, the resultant structure of the thermal process including the adhesive layer 3, the silver conductive layer 5, and the protection layer 7 is patterned using the photosensitive layer pattern 8 as an etching mask, thereby completing the thin film conductor.

Figure 7:
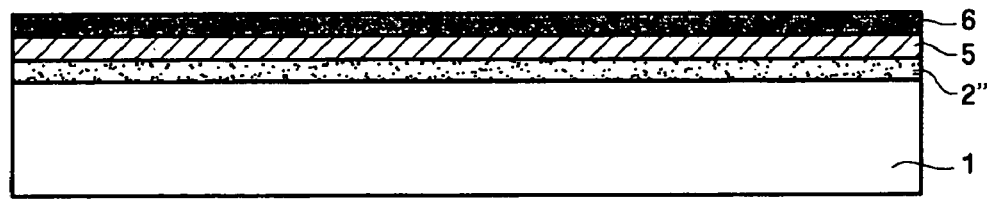
FIGS. 7 through 9 are sectional views showing processing steps of a method for fabricating a thin film conductor according to another embodiment of the present invention.
Figure 8:
Figure 8:
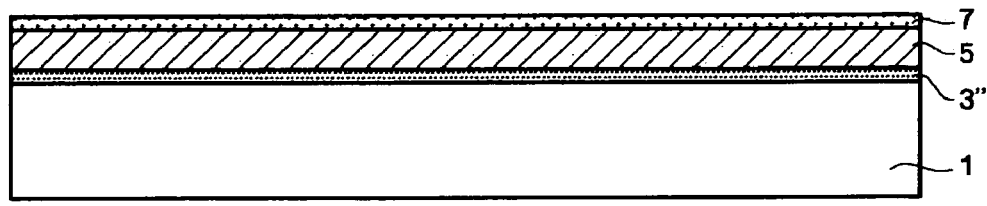
Figure 9:
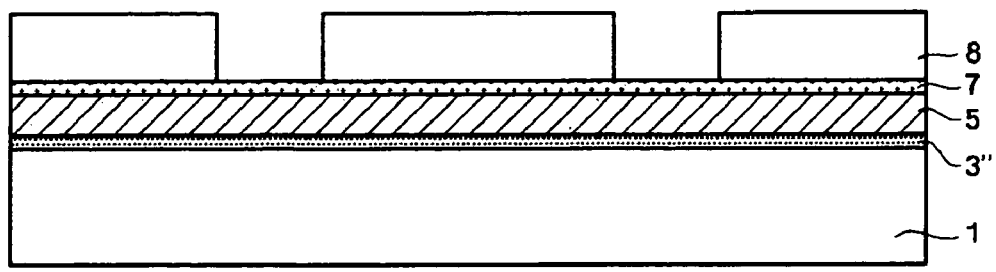

Hereinafter, a method for fabricating a thin film conductor according to another embodiment of the present invention will be described with reference to FIG. 3 and FIGS. 7 through 9. FIGS. 7 through 9 are sectional views showing processing steps of a method for fabricating a thin film conductor according to another embodiment of the present invention.

Referring to FIG. 7, sputtering is performed on a substrate 1 including intrinsic amorphous silicon or doped amorphous silicon with a target of a silver alloy containing silver as a main element and 0.1-50 at % of a silicidation-reactive metal, thereby forming a first silver alloy layer 2" containing a silicidation-reactive metal. Any metal that can cause silicidation when reacting with silicone may be used as the silicidation-reactive metal and examples thereof include at least one selected from the group consisting of, but not limited to, Ca, Th, Co, Ni, Ti, V, Nb, Mo, Ta, W, and Cr. Here, a thickness of the first silver alloy layer 2" is not particularly limited, but, if the first silver alloy layer 2" is formed overly thickly, relative resistance of a thin film conductor formed may undesirably increase. Thus, the first silver alloy layer 2" preferably has a thickness in a range of approximately 100 to 2000 Å.

Next, sputtering is performed on the first silver alloy layer 2" with a target of silver, thereby forming a silver conductive layer 5. The silver conductive layer 5 may serve as a passage of an electric signal, that is, an intrinsic function of a thin film conductor, and may be in a range of 1000-3000 Å in thickness.

Next, sputtering is performed on the silver conductive layer 5 with a target of a silver alloy containing silver as a main element and 0.1-50 at % of an oxidation-reactive metal, thereby forming a second silver alloy layer 6. Any metal that can exhibit high reactivity with oxygen may be used as the silicidation-reactive metal and examples thereof include at least one selected from the group consisting of, but not limited to, Mg, Al, Li, Zn, In and Sn. Here, a thickness of the second silver alloy layer 6 is not particularly limited but, if the second silver alloy layer 6 is formed overly thickly, relative resistance of a thin film conductor formed may undesirably increase. Thus, the second silver alloy layer 6 preferably has a thickness in a range of approximately 500 to 2000 Å.

Next, as shown in FIG. 8, annealing, which is a kind of a thermal process, is performed on the resultant substrate 1 including a first silver alloy layer (2" of FIG. 7), the silver conductive layer 5, and the second silver alloy layer (6" of FIG. 7). The annealing is performed under vacuum, or in an atmosphere of nitrogen or a small amount of oxygen, and the annealing temperature and duration are approximately 200 to 300° C. and approximately 30 minutes to 2 hours, respectively.

As a result of the thermal process, the silicidation-reactive metal included in the first silver alloy layer (2" of FIG. 7) is more rapidly diffused than silver, moves to an interface with the substrate 1, and reacts with silicon included in the substrate 1, thereby forming a silicidized metal. For example, when the silicidation-reactive metal is Ti or Co, it reacts with silicon through a thermal process, thereby forming a silicidized metal such as $TiSi_2$ or $CoSi_2$. A silicidation-reactive metal containing layer improves adhesion to the substrate 1, reduces contact resistance against the substrate 1 and serves as an adhesive layer 3" for preventing silver from being diffused into the substrate 1. A concentration of the oxidation-reactive metal contained in the adhesive layer 3" is not constant. In other words, a concentration gradient is created in such a manner that the concentration of an oxidation-reactive metal included in the adhesive layer 3" increases from an interface between the adhesive layer 3" and the silver conductive layer 5 towards an interface between the substrate 1 and the adhesive layer 3". A thickness of the adhesive layer 3" may vary according to the thickness of the first silver alloy layer (2" of FIG. 7) and the second silver alloy layer (6 of FIG. 7). For example, when the thicknesses of the untreated the first silver alloy layer (2" of FIG. 7) is approximately 1000 Å, the thicknesses of the adhesive layer 3" may be approximately 100 Å.

In addition, as a result of the thermal process, the oxidation-reactive metal included in the second silver alloy layer (6 of FIG. 7) is more rapidly diffused than silver, moves to the surface of the second silver alloy layer (6 of FIG. 7), and reacts with oxygen in the air, thereby forming an oxidized metal. For example, when the oxidation-reactive metal is Mg or Al, it reacts with oxygen through the thermal process, thereby forming an oxidized metal such as MgO or $Al_2O_3$. Such a layer containing the oxidized metal becomes a protection layer 7 protecting the silver conductive layer 5 having poor thermal endurance and chemical resistance. A concentration of the oxidation-reactive metal included in the protection layer 7 is not constant. In other words, a concentration gradient is created in such a manner that the concentration of the oxidation-reactive metal included in the protection layer 7 increases from interface between the silver conductive layer 5 and the protection layer 7 toward a surface of the protection layer 7. A thickness of the protection layer 7 may vary according to a thickness of an untreated second silver alloy layer (6 of FIG. 7). For example, when the thicknesses of the untreated second silver alloy layer 2 is approximately 1000 Å, the thicknesses of the protection layer 7 may be approximately 150 Å.

Next, as shown in FIG. 9, after performing annealing, a photosensitive layer is formed on the resultant structure including the adhesive layer 3", the silver conductive layer 5, and the protection layer 7 and is patterned into a desired shape, thereby completing a photosensitive layer pattern 8. Thereafter, as shown in FIG. 3, the resultant structure of the thermal process including the adhesive layer 3", the silver conductive layer 5, and the protection layer 7 is patterned using the photosensitive layer pattern 8 as an etching mask, thereby forming a thin film conductor.

The thin film conductor and the method for fabricating the same can also be applied to a thin film transistor (TFT) plate and a method for fabricating the same.

Hereinafter, a TFT plate and a method for fabricating the same according to an embodiment of the present invention will be described with reference to the accompanying drawings.

Figure 10A:
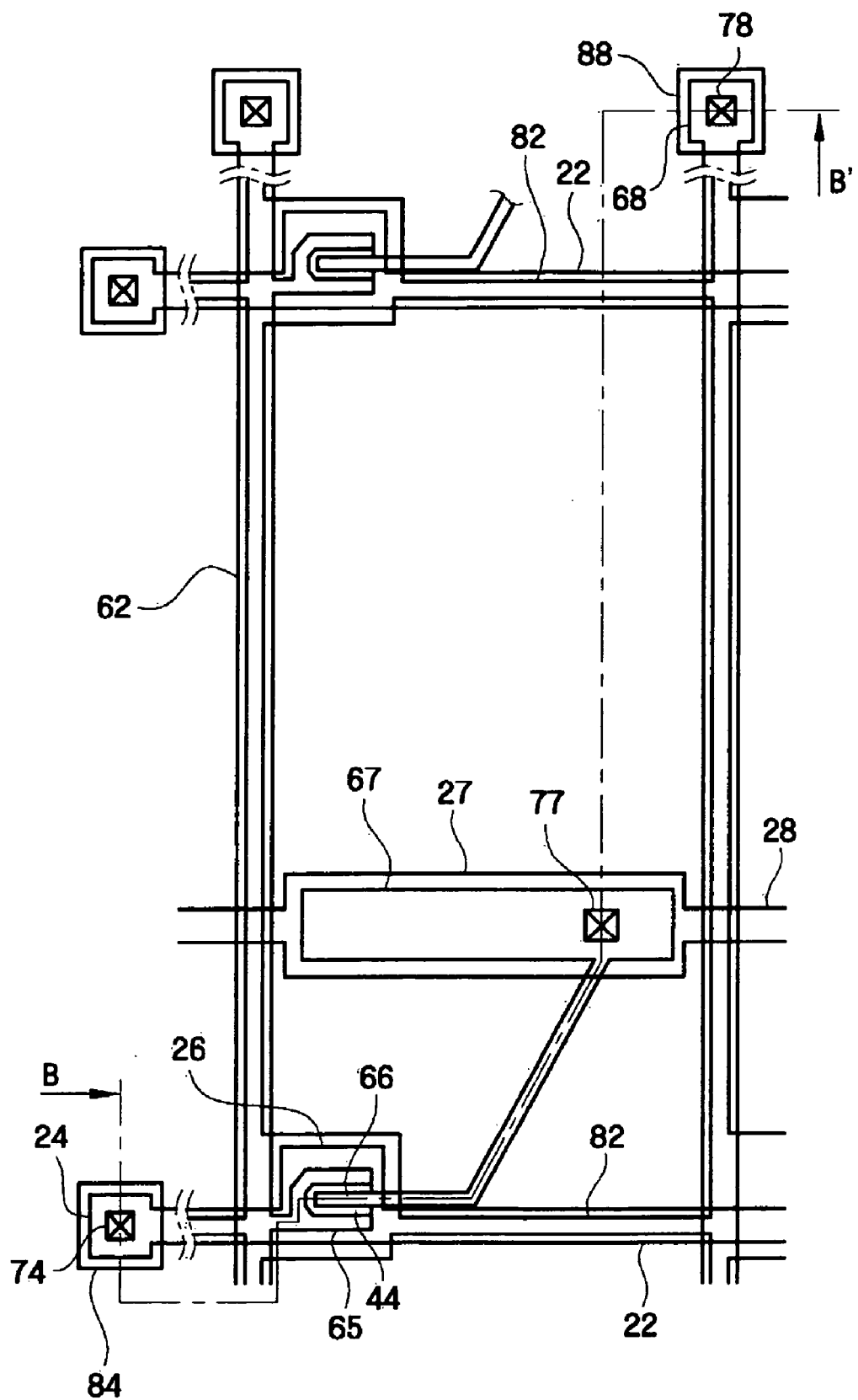
FIG. 10A is a layout view of a thin film transistor (TFT) plate fabricated by a method for fabricating a TFT plate according to another embodiment of the present invention.

First, a TFT plate fabricated by a method for fabricating the TFT plate according to an embodiment of the present invention will be described with reference to FIGS. 10A through 10C. FIG. 10A is a layout view of a thin film transistor (TFT) plate fabricated by a method for fabricating a TFT plate according to another embodiment of the present invention, and FIG. 10B is a sectional view taken along a line B-B' of FIG. 10A.

Figure 10B:
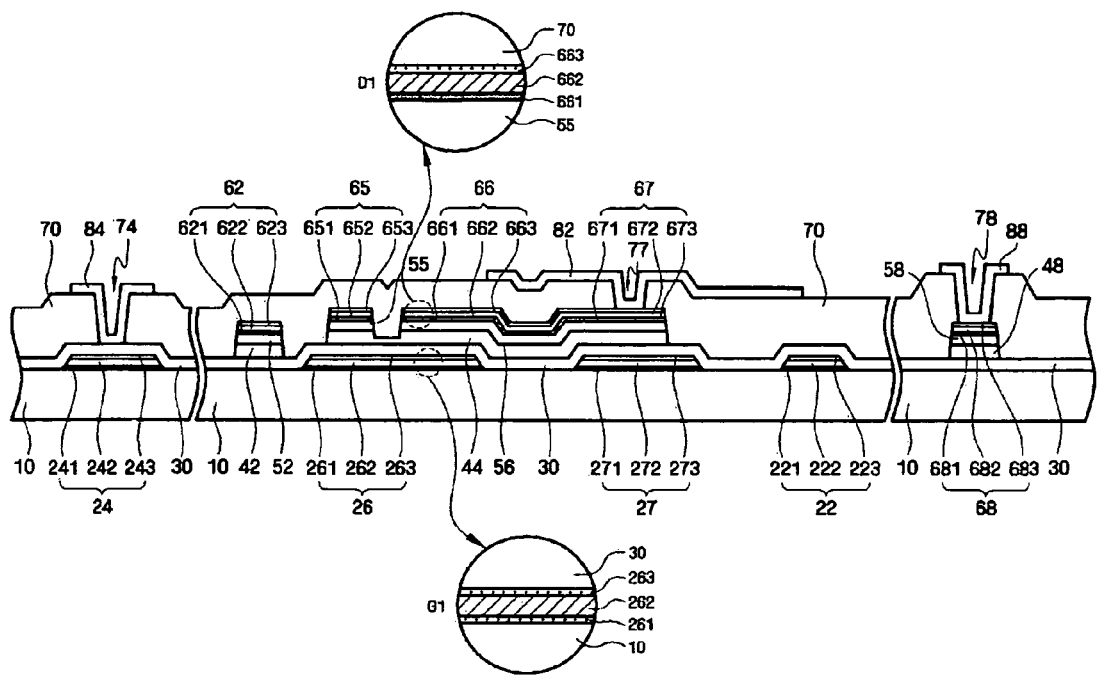
FIGS. 10B and 10C are sectional views taken along a line B-B' of FIG. 10A.
Figure 10C:
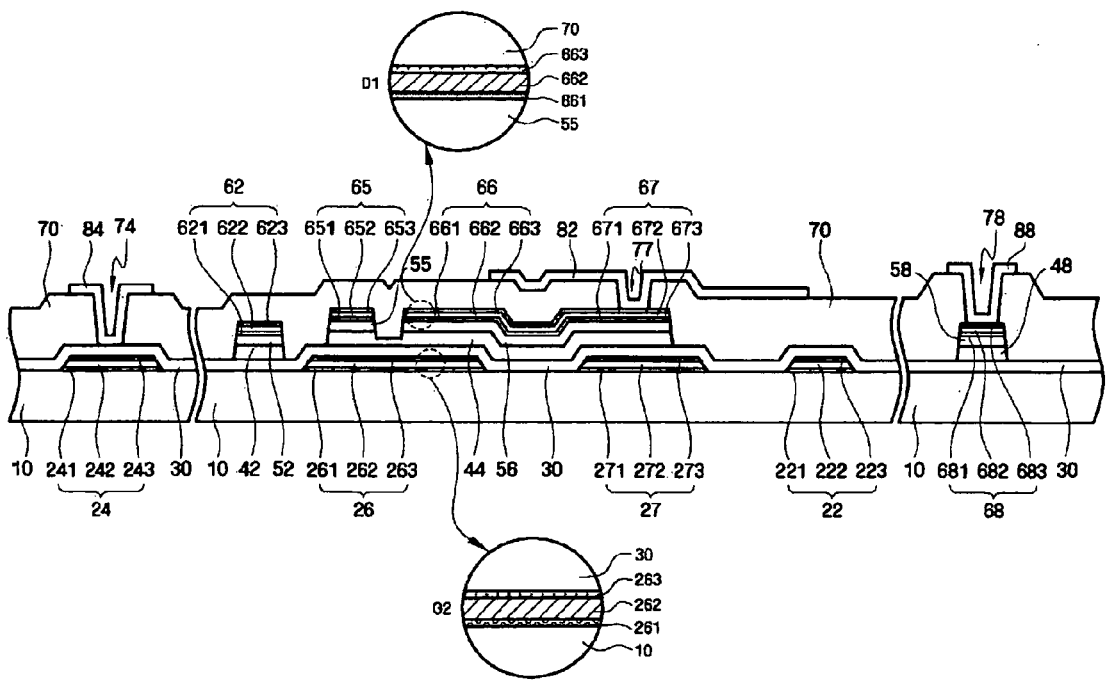

As shown in FIGS. 10A through 10C, a plurality of gate thin film conductors (22, 24, 26, 27, and 28) transmitting a gate signal are formed on a substrate 10. A gate thin film conductor (22, 24, 26, 27, 28) includes a gate line 22 that extends in a row direction, a gate line pad 24 that is connected to the end of the gate line 22 to receive a gate signal from the outside and transmits the same to the gate line 22, a gate electrode 26 of a protruding TFT that is connected to the gate line 22, and a storage electrode 27 and a storage electrode line 28 formed parallel with the gate line 22. The storage electrode line 28 extends in a transverse direction across a pixel region and is connected to the storage electrode 27 that is wider than the storage electrode line 28.

The storage electrode 27 overlapping with a drain electrode extension portion 67 connected with the pixel electrode 82, which will later be described, forms a storage capacitor that enhances a charge storage capacity of a pixel. The shapes and arrangement of the storage electrode 27 and the storage electrode line 28 may vary in various manners. When storage capacitor generated by overlapping of the pixel electrode 82 and the gate line 22 is sufficient, formation of the storage electrode 27 may be omitted.

The gate thin film conductor (22, 24, 26, 27) may have a triple-layered structure including an adhesive layer (221, 241, 261, 271) containing an oxidation-reactive metal having superior adhesion to the substrate 10, a silver conductive layer (222, 242, 262, 272) functioning as an electric signal path, and a protection layer (223, 243, 263, 273) containing an oxidation-reactive metal protecting the silver conductive layer (222, 242, 262, 272) having poor thermal endurance and chemical resistance. At this time, the oxidation-reactive metal is included in the adhesive layer (221, 241, 261, 271) and the protection layer (223, 243, 263, 273) in the form of an oxidized metal.

The adhesive layer (221, 241, 261, 271) and the protection layer (223, 243, 263, 273) may contain the same oxidation-reactive metal as labeled G1 in FIG. 10B or different oxidation-reactive metal as labeled G2 in FIG. 10B. Although not directly shown in the drawing, the storage electrode line 28 may also have the same structure as the gate thin film conductor (22, 24, 26, 27). In the gate thin film conductor having the multi-layered structures which are described below, the storage electrode line 28 is also included and multi-layered characteristics of the gate thin film conductor (22, 24, 26, 27) holds true for the storage electrode line 28 as well.

A gate insulating layer 30 made of silicon nitride (SiNx) is formed on the substrate 10 and the gate thin film conductor (22, 24, 26, 27, 28).

A semiconductor layer 42, 44, 48 made of semiconductor such as hydrogenated amorphous is formed on the gate insulating layer 30. An ohmic contact layer 52, 55, 56, 58 made of silicide or n+ hydrogenated amorphous silicon doped with high concentration n-type impurity is formed on the semiconductor layer 42, 44, 48.

The ohmic contact layer 52, 55, 56, 58 reduces the contact resistance between the underlying semiconductor pattern 42, 44, 48 and the overlying data thin film conductor (62, 65, 66, 67, 68) and has completely the same shape as the data thin film conductor (62, 65, 66, 67, 68). Meanwhile, the semiconductor layers 42, 44, and 48 have substantially the same structures as the data thin film conductor (62, 65, 66, 67, 68) to be described later and the ohmic contact layers 52, 55, 56, 58 except for a TFT channel portion.

A data thin film conductor (62, 65, 66, 67, 68) is formed on the ohmic contact layers 55 and 56 and the gate insulating layer 30. The data thin film conductor (62, 65, 66, 67, 68) includes a data line 62 extending in a longitudinal direction and intersecting the gate line 22 to define pixels, a source electrode 65 connected to the data line 62 and extending over the ohmic contact layer 55, a data line pad 68 connected to an end of the data line 62 and receiving a picture signal from external circuits, a drain electrode 66 spaced apart from the source electrode 65 and formed on the ohmic contact layer 56 to be opposite to the source electrode 65 in view of the gate electrode 26, and a drain electrode extension portion 67 extending from the drain electrode 66 and having a large area overlapping with the storage electrode 27.

The source electrode 65 overlaps with at least a portion of the semiconductor layer 40. The drain electrode 66 is opposing to the source electrode 65 with respect to the gate electrode 26 and overlaps with at least a portion of the semiconductor layer 40.

The drain electrode extension portion 67 overlaps with the storage electrode 27 to form storage capability between the storage electrode 27 and the gate insulating layer 30. When the storage electrode 27 is not formed, the drain electrode extension portion 67 is not formed, either.

As indicated by D1 in FIG. 10B, the data thin film conductor (62, 65, 66, 67, 68) may have a triple-layered structure consisting of an adhesive layer (621, 651, 661, 671, 681) containing a silicidation-reactive metal having superior adhesion to a lower layer and reducing contact resistance, a silver conductive layer (622, 652, 662, 672, 682) functioning as an electric signal path, and a protection layer (623, 653, 663, 673, 683) containing an oxidation-reactive metal protecting the silver conductive layer (622, 652, 662, 672, 682) having poor thermal endurance and chemical resistance. Here, the silicidation-reactive metal is contained in the adhesive layer (621, 651, 661, 671, 681) as an upper layer of the triple-layered structure in the form of a silicidized metal, and the oxidation-reactive metal is contained in the protection layer (623, 653, 663, 673, 683) in the form of an oxidized metal.

The protection layer 70 is formed on the data thin film conductor (62, 65, 66, 67, 68) and an exposed portion the semiconductor layer 40 therethrough. The protection layer 70 is preferably made of an inorganic insulator such as silicon nitride (SiNx) or a low dielectric insulating material such as a-Si:C:O and a-Si:O:F formed by plasma enhanced chemical vapor deposition (PECVD).

In addition, the protection layer 70 is preferably made of an organic insulator (not shown) such as silicon nitride or silicon oxide, a photosensitive organic material having a good flatness characteristic, or a low dielectric insulating material such as a-Si:C:O and a-Si:O:F formed by plasma enhanced chemical vapor deposition (PECVD).

Contact holes 77 and 78 are formed on the protection layer 70, and a contact hole 74 is formed on the protection layer 70 to expose the drain electrode extension portion 67 and the data line pad 68 and the gate insulating layer 30 to expose the gate line pad 24. A pixel electrode 82 is formed on the protection layer 70 in such a way to be electrically connected to the drain electrode 66 via the contact hole 77 and positioned in a pixel area. Electric fields are generated between the pixel electrode 82 supplied with the data voltages and a common electrode of an upper display substrate, which determine an orientation of liquid crystal molecules in the LC layer between the pixel electrode 82 and the common electrode.

Furthermore, an auxiliary gate line pad 84 and an auxiliary data line pad 88 are formed on the protection layer 70 in such a way to be connected to the gate line pad 24 and the data line pad 68 via the contact holes 74 and 78, respectively. The pixel electrode 82 and the auxiliary gate and data line pads 86 and 88 are preferably made of ITO or IZO.

Hereinafter, a method for fabricating a TFT plate using the method for fabricating a thin film conductor according to the embodiment of the present invention will be described in detail with reference to FIGS. 10A through 10C and FIGS. 11A through 19B.

Figure 11A:
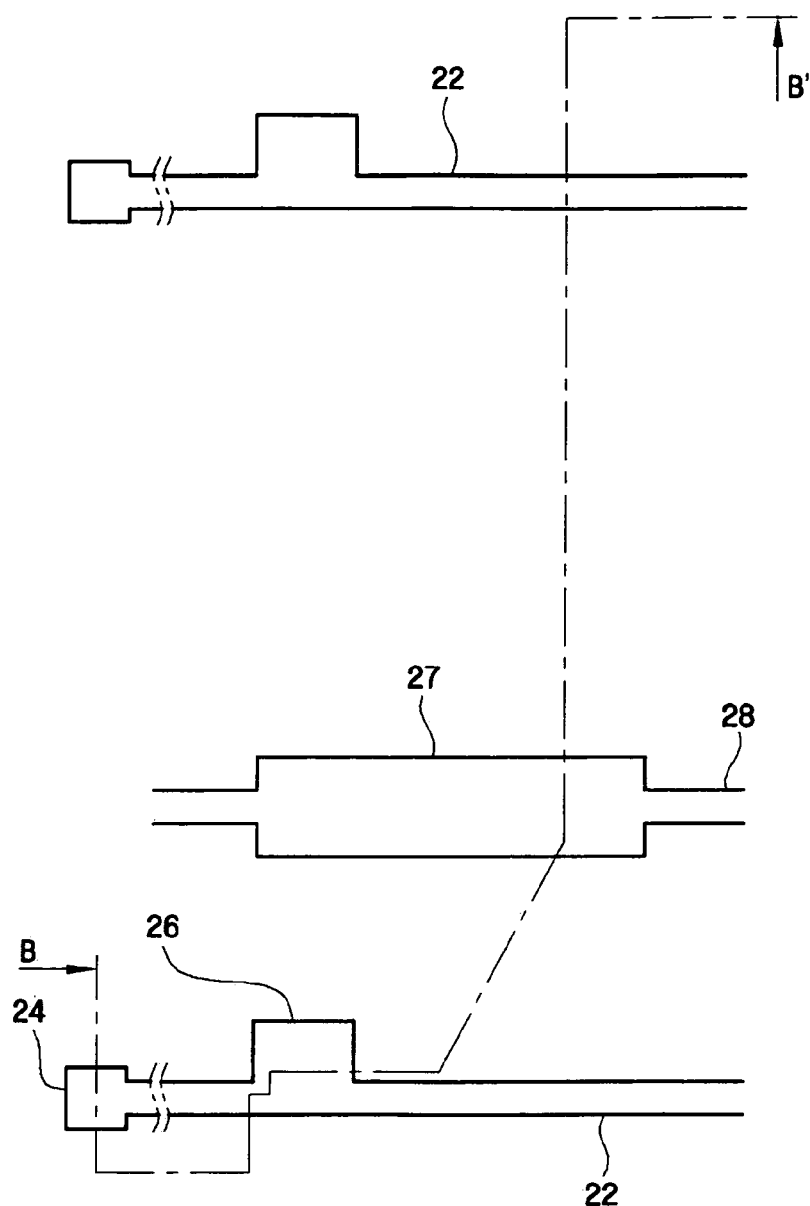
FIGS. 11A, 13A, and 19A are layout views sequentially showing a method for fabricating a TFT plate according to another embodiment of the present invention.
Figure 11B:
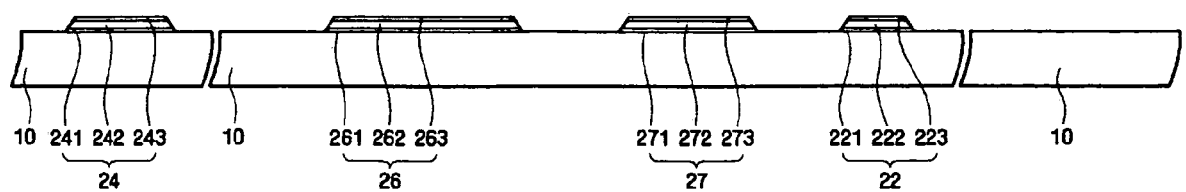
FIGS. 11B and 12 are sectional views showing processing steps taken along a line B-B' of FIG. 11A.

First, as shown in FIGS. 11A and 11B, sputtering is performed on a glass substrate 1 made of $SiO_2$ with a target of a silver alloy containing silver as a main element and 0.1-50 at % of an oxidation-reactive metal, thereby forming a first silver alloy layer. After sputtering is performed with a target of silver to form a silver conductive layer, sputtering is performed with a target of a silver alloy containing 0.1-50 at % of an oxidation-reactive metal to form a second silver alloy layer.

Here, the oxidation-reactive metals contained in the first and second silver alloy layers may be the same as or different from each other. Any metal that may cause an oxidation reaction when it reacts with oxygen can be used as the oxidation-reactive metal and may be at least one selected from the group consisting of Mg, Al, Li, Zn, In, and Sn. Thicknesses of the first silver alloy layer, the silver conductive layer and the second silver alloy layer are not particularly specified but if the resistivity of a thin film conductor formed may undesirably increase when the thicknesses thereof are overly thick, it is preferable that thicknesses thereof range from approximately 100 to approximately 2000 Å, from approximately 1000 to approximately 3000 Å, and from approximately 500 to approximately 2000 Å, respectively.

The triple-layered metal structure is annealed at approximately 200-300° C. for approximately 30 minutes-2 hours in a vacuum atmosphere or an atmosphere including nitrogen or a small amount of oxygen. As a result, the oxidation-reactive metal in the first silver alloy layer is diffused to an interface with the substrate 10 and reacts with $SiO_2$ of the substrate 10, thereby forming an oxidized metal. The oxidation-reactive metal in the second silver alloy layer is diffused to a surface of the second silver alloy layer and reacts with oxygen in the air, thereby forming an oxidized metal. Therefore, the first silver alloy layer, the silver conductive layer and the second silver alloy layer are turned into the adhesive layer (221, 241, 261,

271) having excellent adhesion to the substrate 10 due to thermal treatment, the silver conductive layer (222, 242, 262, 272) functioning as an electric signal path, and the protection layer (223, 243, 263, 273) protecting the silver conductive layer (222, 242, 262, 272) having poor having poor thermal endurance and chemical resistance, respectively. In this case, a concentration gradient is created in such a manner that a concentration of oxidation-reactive metals contained in the adhesive layer (221, 241, 261, 271) and the protection layer (223, 243, 263, 273) increases from an interface between the silver conductive layer (222, 242, 262, 272) and each of the adhesive layer (221, 241, 261, 271) and the protection layer (223, 243, 263, 273) and toward a surface of the resultant structure.

The resultant structure is patterned, thereby completing the gate thin film conductor (22, 24, 26, 27, and 28) including the gate line 22, the gate electrode 26, the gate line pad 24, the storage electrode 27, and the storage electrode line 28.

Figure 12:
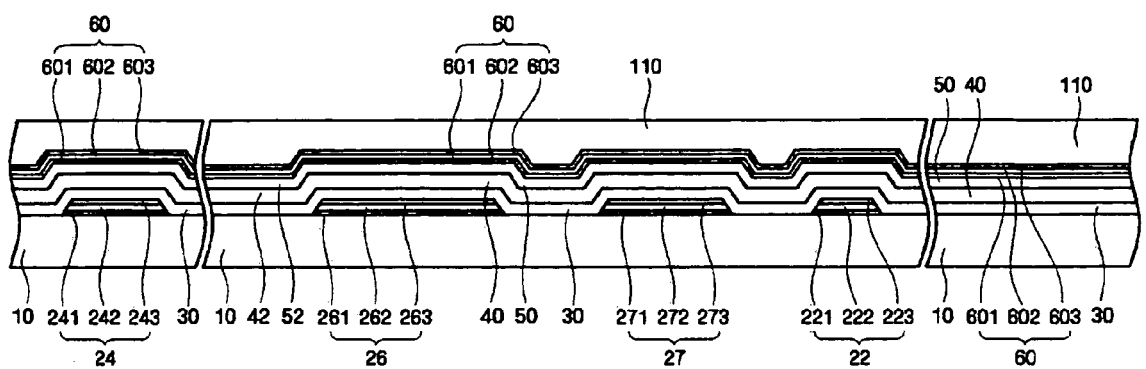

Next, as shown in FIG. 12, the gate insulating layer 30 made of silicon nitride, the intrinsic amorphous silicon layer 40, and the doped amorphous silicon layer 50 are sequentially deposed to thicknesses of 1500-5000 Å, 500-2000 Å, and 300-600 Å by, for example, chemical vapor deposition (CVD), respectively.

Next, sputtering is performed on the amorphous silicon layer 50 with a target of a silver ally containing silver as a main element and 0.1-50 at % of a silicidation-reactive metal, thereby forming a third silver alloy layer. Next, sputtering is performed on the silver alloy target with a target of silver to form a silver conductive layer, sputtering is performed on a silver alloy target containing 0.1-50 at % of an oxidation-reactive metal, thereby forming a fourth silver alloy layer.

Here, any metal that may cause silicidation when reacting with silicone may be used as the silicidation-reactive metal and examples thereof include at least one selected from the group consisting of, but not limited to, Ca, Th, Co, Ni, Ti, V, Nb, Mo, Ta, W, and Cr. In addition, any metal that may cause an oxidation reaction when it reacts with oxygen may be used as the oxidation-reactive metal included in the fourth silver alloy layer and examples thereof include at least one selected from the group consisting of, but not limited to, Mg, Al, Li, Zn, In and Sn. Thicknesses of the third silver alloy layer, the silver conductive layer, the fourth silver alloy layer are not particularly limited and it is preferable that their thicknesses be in ranges of approximately 100 to 2000 Å, approximately 1000 to 3000 Å, and approximately 500 to 2000 Å, respectively, so that relative resistance of a thin film conductor formed may not undesirably increase.

The triple-layered structure is annealed at approximately 200-300° C. for approximately 30 minutes-2 hours in a vacuum atmosphere or an atmosphere containing nitrogen or a small amount of oxygen. As a result, the silicidation-reactive metal in the third silver alloy layer is diffused to an interface between the intrinsic amorphous silicone layer 40 and the doped amorphous silicone layer 50 to then react with silicon therein, thereby forming a silicidized metal. In addition, the oxidation-reactive metal in the fourth silver alloy layer is diffused to a surface of the fourth silver alloy layer and reacts with oxygen in the air, thereby forming an oxidized metal. Therefore, the third silver alloy layer, the silver conductive layer and the fourth silver alloy layer are turned into the adhesive layer 601 having excellent adhesion to the underlying layer due to thermal treatment, the silver conductive layer 602 functioning as an electric signal path, and the protection layer 603 protecting the silver conductive layer 602 having poor thermal endurance and chemical resistance, respectively. Here, a concentration gradient is created in such a manner that concentration of the silicidation-reactive metal increases from the interface between the silver conductive layer 602 and the adhesive layer 601 toward the interface between the adhesive layer and the amorphous silicone layer 40 and the doped amorphous silicone layer. A concentration gradient also is created in such a manner that concentration of the oxidation-reactive metal increases from the interface between the protection layer 603 and the silver conductive layer 602 toward a surface of the protection layer 603.

A photosensitive layer 110 is then coated on the annealed structure.

Figure 13A:
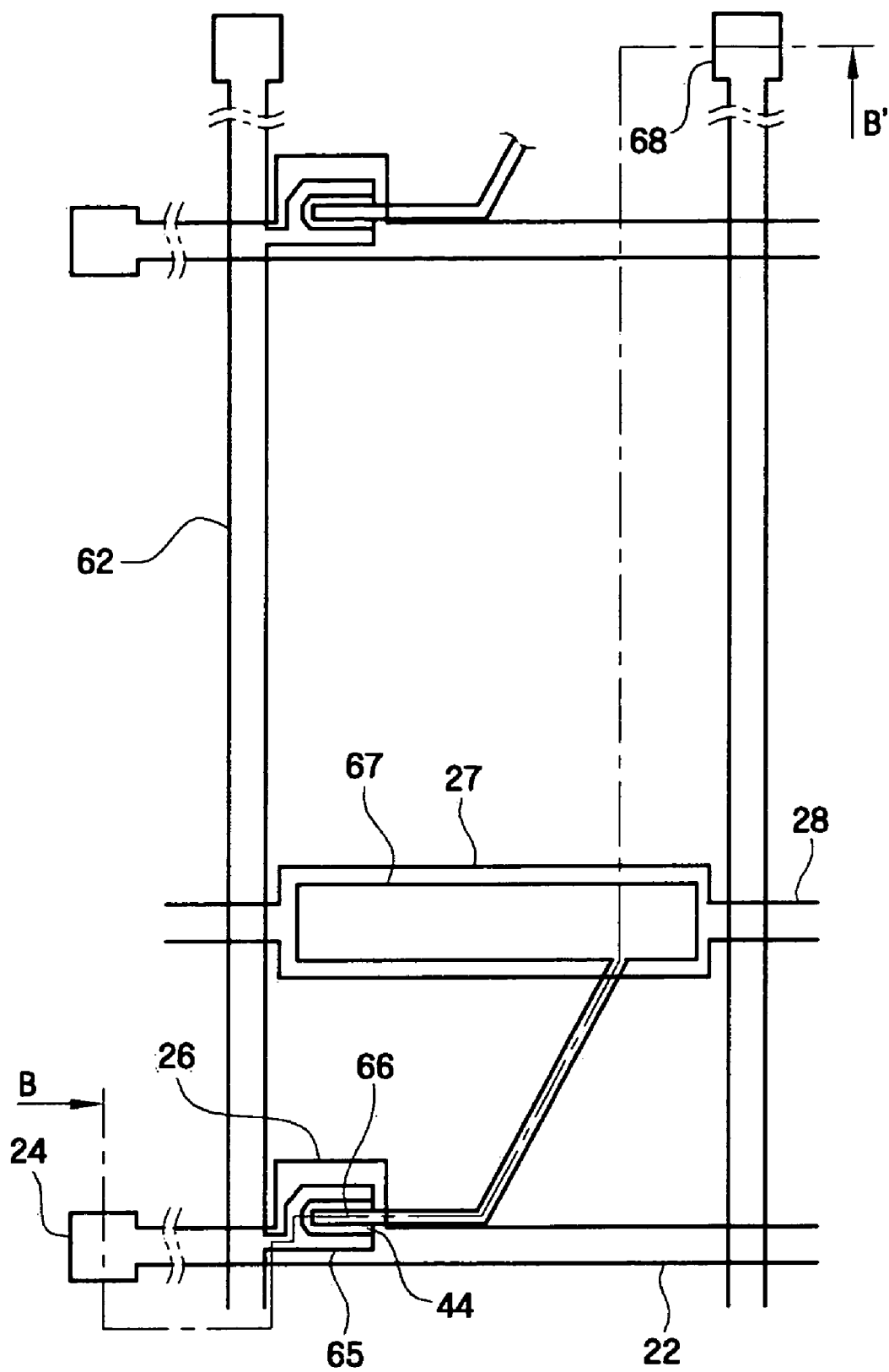
Figure 13B:
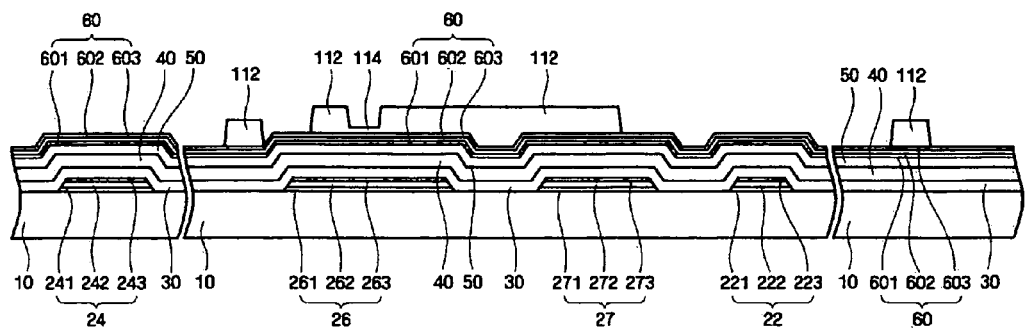

Next, as shown in FIGS. 13A and 13B, light is irradiated to the photosensitive layer 110 through a mask (not shown) and is developed, thereby forming photosensitive layer patterns 112 and 114. Here, of the two photosensitive layer patterns 112 and 114, a TFT channel portion, i.e., the first portion 114 positioned between a source electrode (65 of FIGS. 10B and 10C) and a drain electrode (66 of FIGS. 10B and 10C) has a smaller thickness than the second portion 112 positioned in a data thin film conductor portion, i.e., a potential portion where a data thin film conductor is to be formed. The photosensitive layer patterns remaining in portions other than the channel portion and the data thin film conductor portion are all removed. In this case, a ratio of a thickness the photosensitive layer pattern 114 remaining in the channel portion to a thickness of the photosensitive layer pattern 112 remaining in the data thin film conductor portion varies with etching process conditions, which will later be described. For example, the thickness of the first portion 114 may be smaller than or equal to half, e.g., 4000 Å, the thickness of the second portion 112.

Figure 14:
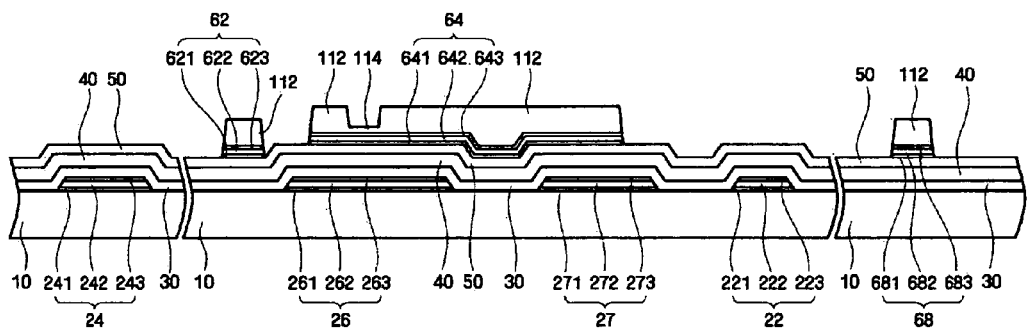

Next, the resultant structure including the protection layer 603, the silver conductive layer 602, and the adhesive layer 601 is patterned using the photosensitive layer patterns 112 and 114 as etching masks. As a result, as shown in FIG. 14, only the triple-layered patterns having the channel portion and the data thin film conductor portion remain and portions other than the channel portion and the data thin film conductor portion are all removed, so that the doped amorphous silicon layer 50 is exposed. The remaining triple-layered patterns have substantially the same shapes as the finally formed data thin film conductor except that the source electrode (65 of FIGS. 10B and 10C) and the drain electrode (66 of FIGS. 10B and 10C) are not disconnected from each other.

Figure 15:
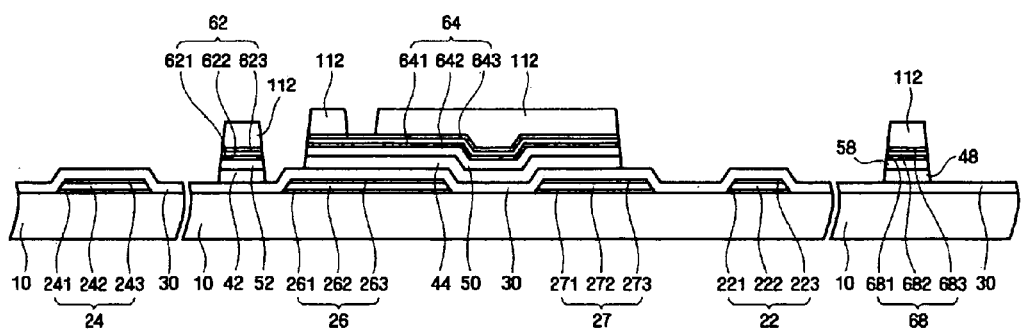

Next, as shown in FIG. 15, the exposed doped amorphous silicon layer 50 in the portions other than the channel portion and the data thin film conductor portion, the intrinsic amorphous silicon layer 40 and the first portion 114 of the photosensitive layer 110 are simultaneously removed by dry etching and ashing is then performed to remove photosensitive layer remnants remaining on the surface of a source/drain triple-layered pattern 64 of the channel portion.

Figure 16:
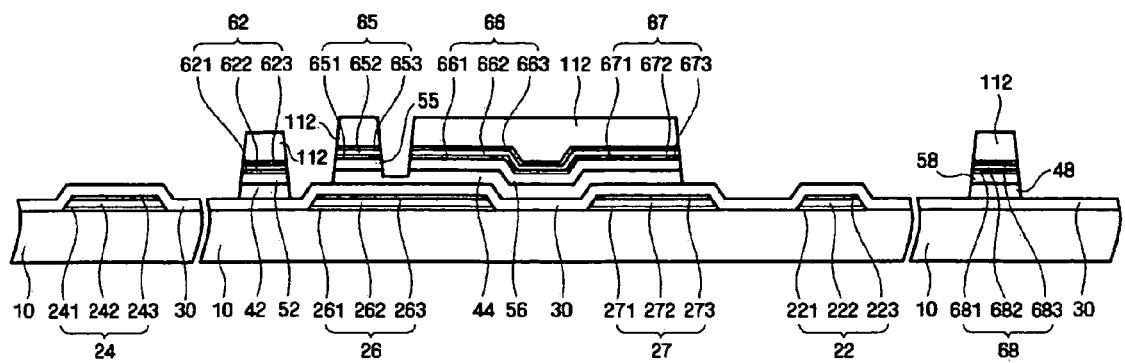

Next, as shown in FIG. 16, the triple-layered pattern of the channel portion including the protection layer 643, the silver conductive layer 642, and the adhesive layer 641 is etched for removal, and the ohmic contact layers 52, 55, 56, and 58 made of doped amorphous silicon are formed using, for example, dry etching. A portion of the semiconductor layer 44 may be removed and thus, a thickness of the semiconductor layer 44 may decrease. In addition, the second portion 112 of the photosensitive layer pattern may be etched to a predetermined thickness. As a result, the source electrode 65 and the drain electrode 66 are separated from each other and data thin film conductors 65 and 66 and the ohmic contact layers 55 and 56 disposed thereunder are completed.

Figure 17:
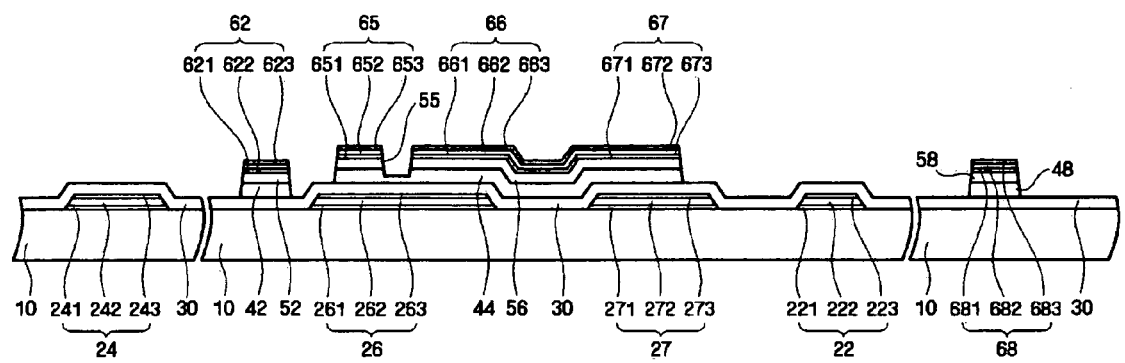

Next, as shown in FIG. 17, the second portion (112 of FIG. 16) of the photosensitive layer remaining in the data thin film conductor portion is removed.

Figure 18:
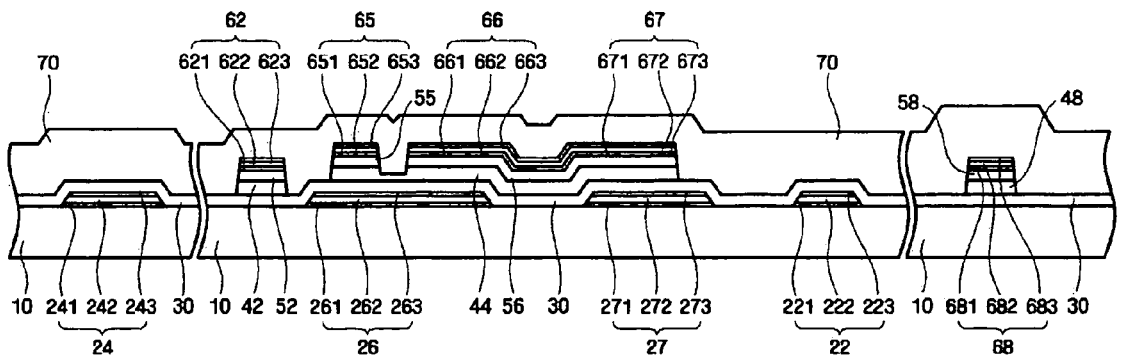

Next, as shown in FIG. 18, the protection layer 70 is formed of a single layer or multi-layers made of an organic material having a superior flatness characteristic and superior photosensitivity, a low dielectric constant insulating material formed by plasma enhanced chemical vapor deposition (PECVD) such as a-Si:C:O or a-Si:O:F, or an inorganic material such as silicon nitride (SiNx).

Figure 19A:
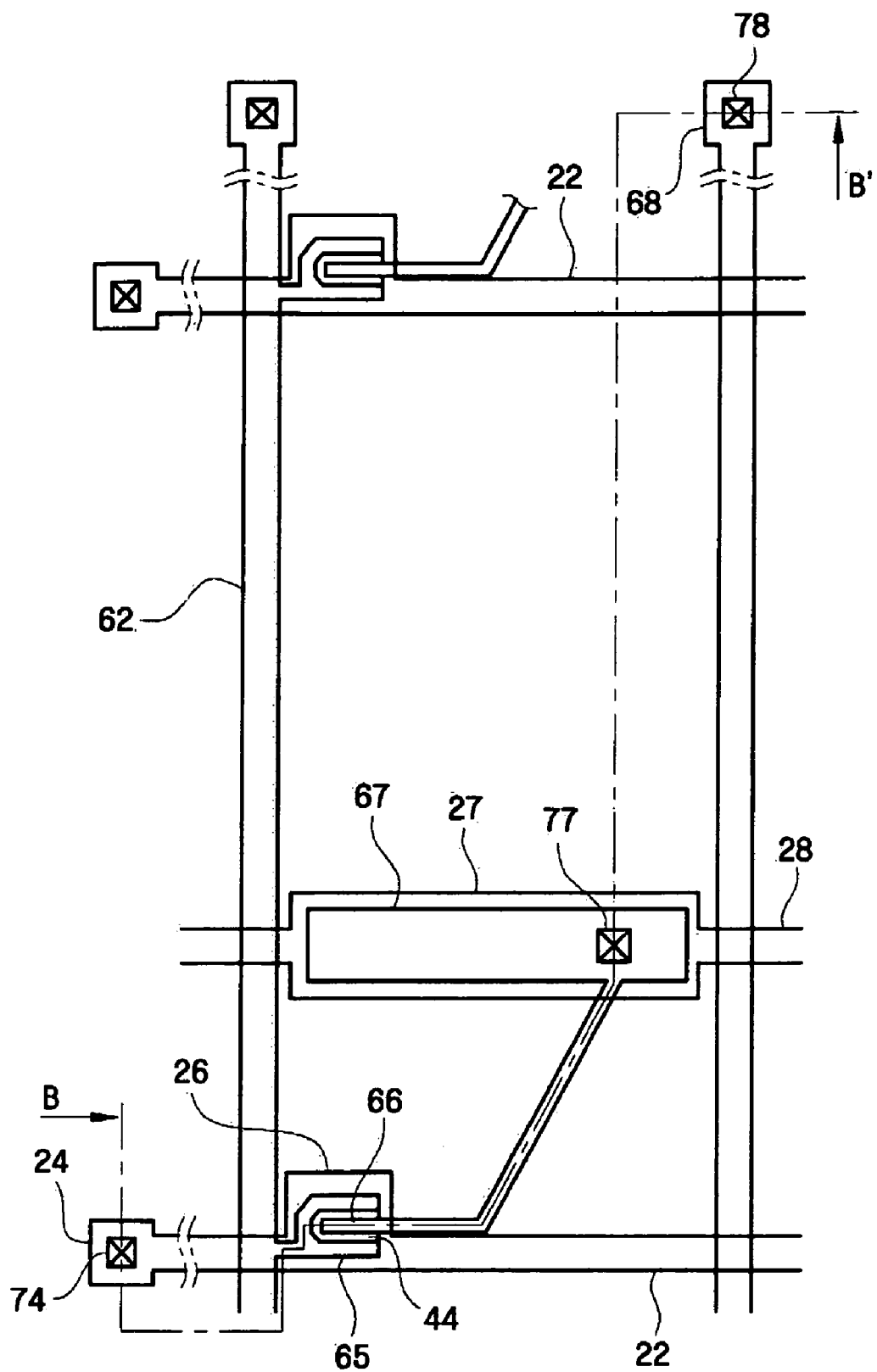
Figure 19B:
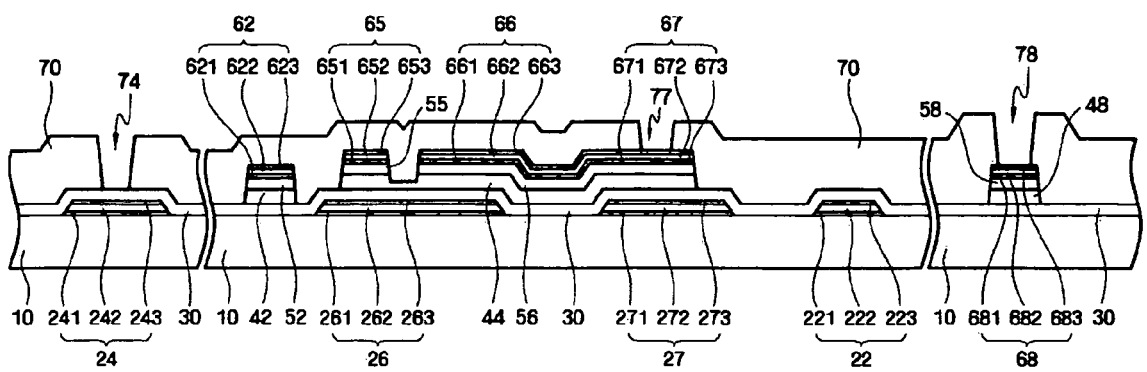
FIG. 19B is a sectional view showing processing steps taken along a line B-B' of FIG. 19A.

Next, as shown in FIGS. 19A and 19B, the gate insulating layer 30 and the protection layer 70 are patterned by photolithography, thereby forming the contact holes 74, 77, and 78 exposing the gate line pad 24, the drain electrode extension portion 67, and the data line pad 68, respectively. When the protection layer 70 is made of an organic material with photosensitive property, the contact holes 74, 77, and 78 can be formed using only photolithography. At this time, the photolithography may be performed under an etching condition such that the etching ratio for the gate insulating layer 30 and the protection layer 70 is substantially the same.

Finally, as shown in FIGS. 10A through 10C, a transparent conductive material such as indium tin oxide (ITO) or indium zinc oxide (IZO) is deposited and photolithography is performed on the transparent conductive material, thereby forming the pixel electrode 82 connected to the drain electrode 66 via the contact hole 77, and the auxiliary gate line pad 84 and the auxiliary data line pad 88 connected to the gate line pad 24 and the data line pad 68 via the contact holes 74 and 78.

Although a TFT substrate having a semiconductor layer and a data thin film conductor formed by photolithography using substantially the same photoresist patterns and a method for fabricating the TFT substrate thereof are described in the illustrative embodiment of the present invention, the present invention can also be applied to a TFT substrate having a semiconductor layer and a data thin film conductor formed by photolithography using different masks.

In addition, although a TFT plate including a data thin film conductor having an adhesive layer containing a silicidation-reactive metal has been described by way of example, the illustrated example is are provided only for illustration and the invention may also be applied to a TFT plate including a data thin film conductor having an adhesive layer containing an oxidation-reactive metal.

As described above, in a gate thin film conductor or a data thin film conductor of a TFT plate fabricated using the method for fabricating the thin film conductor according to the present invention, an adhesive layer is formed under a silver conductive layer to improve adhesion to a lower layer and a protection layer is formed on the silver conductive layer to protect the silver conductive layer. Thus, lifting or peeling of the gate thin film conductor or the data thin film conductor can be prevented, thereby improving a signal characteristic and the image quality of a liquid crystal display (LCD) device.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A thin film conductor comprising:
   an adhesive layer for adhering said thin film conductor to a substrate, said adhesive layer containing an oxidation-reactive metal or a silicidation-reactive metal and silver;
   a silver conductive layer formed on the adhesive layer; and
   a protection layer formed on the silver conductive layer and containing an oxidation-reactive metal and silver,
   wherein the adhesive layer includes a concentration of gradient that a concentration of the oxidation-reactive metal or silicidation-reactive metal increases towards an interface between the substrate and the adhesive layer from an interface between the adhesive layer and the silver conductive layer.

2. The thin film conductor of claim 1, wherein the same oxidation-reactive metal is included in the adhesive layer and in the protection layer.

3. The thin film conductor of claim 1, wherein the oxidation-reactive metal contained in the adhesive layer and the protection layer includes at least one selected from the group consisting of Mg, Al, Li, Zn, In, and Sn.

4. The thin film conductor of claim 1, wherein the adhesive layer or the protection layer includes 0.1-50 at % of the oxidation reactive metal.

5. The thin film conductor of claim 1, wherein the adhesive layer containing the silicidation-reactive metal further comprises a silicon layer thereunder.

6. The thin film conductor of claim 1, wherein the silicidation-reactive metal includes at least one selected from the group consisting of Ca, Th, Zr, Co, Ni, Ti, V, Nb, Mo, Ta, W, and Cr.

7. The thin film conductor of claim 1, wherein the adhesive layer includes the silicidation-reactive metal in an amount of 0.1-50 at %.

8. The thin film conductor of claim 5, wherein the silicidation-reactive metal included in the adhesive layer reacts with silicon to form a silicidized metal.

9. The thin film conductor of claim 1, wherein the oxidation-reactive metal included in the adhesive layer reacts with oxygen to form an oxidized metal.

10. The thin film conductor of claim 1, wherein the oxidation-reactive metal included in the protection layer reacts with ambient oxygen to form an oxidized surface.

11. A thin film transistor (TFT) plate comprising:
    a gate thin film conductor including a gate line extending in a first direction; and
    a data thin film conductor including a data line insulated from the gate thin film conductor, intersecting the gate thin film conductor, and extending in a second direction,
    wherein at least one selected from the group consisting of the gate thin film conductor and the data thin film conductor includes a thin film conductor where an adhesive layer containing a silicidation-reactive metal or an oxidation-reactive metal and silver, a silver conductive layer, and a protection layer containing an oxidation-reactive metal and silver are sequentially deposited,
    wherein the adhesive layer includes a concentration of gradient that a concentration of the oxidation-reactive metal or silicidation-reactive metal increases towards an interface between a substrate and the adhesive layer from an interface between the adhesive layer and the silver conductive layer.

12. The TFT plate of claim 11, wherein the oxidation-reactive metal contained in the adhesive layer and the protection layer includes at least one selected from the group consisting of Mg, Al, Li, Zn, In, and Sn.

13. The TFT plate of claim 11, wherein the adhesive layer or the protection layer includes the oxidation-reactive metal in an amount of 0.1-50 at %.

14. The TFT plate of claim 11, wherein the adhesive layer containing a silicidation-reactive metal includes a silicon layer disposed thereunder.

15. The TFT plate of claim 14, wherein the silicon layer is a semiconductor layer or an ohmic contact layer.

16. The TFT plate of claim 11, wherein the silicidation-reactive metal includes at least one selected from the group consisting of Ca, Th, Zr, Co, Ni, Ti, V, Nb, Mo, Ta, W, and Cr.

17. The TFT plate of claim 11, wherein the adhesive layer includes the silicidation-reactive metal in an amount of 0.1-50 at %.

18. The TFT plate of claim 11, wherein the silicidation-reactive metal included in the adhesive layer reacts with silicon and is included in the form of a silicidized metal, or the oxidation-reactive metal included in the adhesive layer reacts with oxygen and is included in the form of an oxidized metal.

19. The TFT plate of claim 11, wherein the oxidation-reactive metal included in the protection layer reacts with oxygen.

* * * * *